(12) United States Patent
Mostafazadeh

(10) Patent No.: US 6,689,640 B1
(45) Date of Patent: Feb. 10, 2004

(54) CHIP SCALE PIN ARRAY

(75) Inventor: Shahram Mostafazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/698,736

(22) Filed: Oct. 26, 2000

(51) Int. Cl.[7] ............................................. H01L 21/44
(52) U.S. Cl. ...................... 438/121; 438/123; 438/124; 257/666; 257/676
(58) Field of Search ........................ 438/121, 123–124, 438/106, 111, 112, 107, 109; 257/666, 676, 738, 737, 778, 779, 780, 777

(56) References Cited

U.S. PATENT DOCUMENTS

| | | | |
|---|---|---|---|
| 5,075,760 A | * 12/1991 | Nakashima et al. | .......... 357/70 |
| 5,585,195 A | 12/1996 | Shmiada | |
| 5,656,550 A | 8/1997 | Tsuji et al. | |
| 5,759,874 A | 6/1998 | Okawa | |
| 5,830,800 A | * 11/1998 | Lin | ............. 438/459 |
| 5,847,458 A | 12/1998 | Nakamura et al. | |
| 5,895,234 A | 4/1999 | Taniguchi et al. | |
| 5,923,080 A | 7/1999 | Chun | |
| 5,998,875 A | 12/1999 | Bodö | |
| 6,034,422 A | 3/2000 | Horita et al. | |
| 6,100,594 A | 8/2000 | Fukui et al. | |
| 6,157,080 A | * 12/2000 | Tamaki et al. | ............... 257/738 |
| 6,177,288 B1 | 1/2001 | Takiar | |
| 6,238,952 B1 | 5/2001 | Lin | |
| 6,247,229 B1 | * 6/2001 | Glenn | .................. 29/841 |
| 6,255,740 B1 | 7/2001 | Tsuji et al. | |
| 6,258,626 B1 | * 7/2001 | Wang et al. | ................. 438/107 |
| 6,261,864 B1 | 7/2001 | Jung et al. | |
| 6,306,684 B1 | 10/2001 | Richardson et al. | |
| 6,306,685 B1 | 10/2001 | Liu et al. | |
| 6,307,755 B1 | 10/2001 | Williams et al. | |
| 6,316,837 B1 | 11/2001 | Song | |
| 6,333,252 B1 | 12/2001 | Jung et al. | |
| 6,342,730 B1 | 1/2002 | Jung et al. | |
| 6,355,507 B1 | 3/2002 | Fanworth | |
| 6,358,778 B1 | * 3/2002 | Shinohara | ................... 438/123 |
| 6,451,627 B1 | 9/2002 | Coffman | |

OTHER PUBLICATIONS

U.S. patent application No. 09/054,422, entitled "Lead Frame Chip Scale Package", filed Apr. 2, 1998, inventor(s): Shahram Mostafazadeh.
U.S. patent application No. 09/528,540, entitled "Leadless Packaging Process Using a Conductive Substrate", filed Mar. 20, 2000, inventor(s): Bayan et al.
U.S. patent application No. 09/590,551, entitled "Lead Frame Design for Chip Scale Package", filed Jun. 2, 2000, inventor(s): Shahram Mostafazadeh.
U.S. patent application No. 09/698,784, entitled "Flip Chip Scale Package", filed Oct. 26, 2000, inventor(s): Shahram Mostafazadeh.

* cited by examiner

Primary Examiner—David L. Talbott
Assistant Examiner—Luan Thai
(74) Attorney, Agent, or Firm—Beyer Weaver & Thomas LLP

(57) ABSTRACT

An integrated circuit package with lead fingers with a footprint on the order of the integrated circuit footprint is provided. A lead frame may be made from a metal sheet, which may be stamped or etched. The lead frame provides a plurality of posts and a connecting sheet connecting the plurality of posts. Dice are adhesively mounted to the plurality of posts. The dice have a conductive side with a plurality of conducting pads where each conducting pad is electrically and mechanically connected to a post. An encapsulating material is placed over the dice and lead frame, with the connecting sheet keeping the encapsulating material on one side of the lead frame. Parts of the connecting sheet are then removed, electrically isolating the posts. The integrated circuit packages formed by the encapsulated dice and leads may be tested as a panel, before the integrated circuit packages are singulated.

20 Claims, 10 Drawing Sheets

CHIP SCALE PIN ARRAY

RELATED APPLICATIONS

This application is related to the commonly assigned Application No.:09/590,551 entitled "LEAD FRAME DESIGN FOR CHIP SCALE PACKAGE," filed on Jun. 9, 2000 by Shahram Mostafazadeh, and incorporated herein by reference.

This application is related to the commonly assigned Application No.: 09/698,784 (Attorney Docket No.: NSC1P195) entitled "FLIP CHIP SCALE PACKAGE," filed on even date by Shahram Mostafazadeh herewith and incorporated herein by reference.

FIELD OF THE INVENTION

The present invention relates generally to integrated circuit packages. More specifically, the invention relates to chip scale integrated circuit packages.

BACKGROUND OF THE INVENTION

An integrated circuit (IC) package encapsulates an IC chip (die) in a protective casing and may also provide power and signal distribution between the IC chip and an external printed circuit board (PCB). An IC package may use a metal lead frame to provide electrical paths for that distribution.

To facilitate discussion, FIG. 1 is a top view of a lead frame panel 100 made up for a plurality of lead frames that may be used in the prior art. The lead frame may comprise leads 108, die attach pads 112, ties 116 for supporting the die attach pads 112, and a skirt 120 for supporting the plurality of leads 108 and ties 116. The lead frame panel 100 may be etched or stamped from a thin sheet of metal. IC chips 124 may be mounted to the die attach pads 112 by an adhesive epoxy. Wire bonds 128, typically of fine gold wire, may then be added to electrically connect the IC chips 124 to the leads 108. Each IC chip 124 may then be encapsulated with part of the leads 108 and the die attach pad 112 in a protective casing, which may be produced by installing a preformed plastic or ceramic housing around each IC chip or by dispensing and molding a layer of encapsulating material over all IC chips 124. FIG. 2 is a cross-sectional view of part of the lead frame panel 100 and IC chips 124. In a process described in U.S. patent application Ser. No. 09/054,422, entitled "Lead Frame Chip Scale Package", by Shahram Mostafazadeh et al., filed Apr. 2, 1998, a tape 136 is placed across the bottom of the lead frame panel 100 and an encapsulating process is used to encapsulate the IC chips 124, the wire bonds 128, and part of the lead frame panel 100. The tape 136 prevents the encapsulating material 140 from passing through the lead frame panel 100. Once the encapsulating material 140 is hardened, the tape 136 may be removed. The encapsulating material 140 may be cut to singulate the IC chips 124 and leads 108. The resulting singulated IC chips have leads with a length 155 which is substantially parallel to the conductive surface of the IC chips 124.

It is desirable to provide an IC package process which does not require the steps of creating wire bonds between the die and leads, adding tape to the lead frame, and then removing the tape from the lead frame. It is also desirable to provide a process and lead frame that provides lead fingers and a chip scale footprint.

SUMMARY OF THE INVENTION

To achieve the foregoing and other objects and in accordance with the purpose of the present invention, the invention provides an integrated circuit package. The integrated circuit package comprises a first die with a conductive side, a plurality of lead posts where the conductive side of the first die faces the plurality of lead posts, and an encapsulating material encapsulating the first die and an end of the lead posts adjacent to the conductive side of the die.

Another aspect of the invention provides a method for packaging integrated circuits. Generally, a lead frame of a conductive material with a plurality of lead posts and a connecting sheet connecting the plurality of lead posts is provided. A plurality of first dice is attached to the lead frame, wherein each first die is electrically and mechanically connected to a plurality of the plurality of lead posts, and wherein a conductive side of each first die faces the plurality of lead posts. The plurality of dice is then encapsulated with an encapsulating material.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 3:
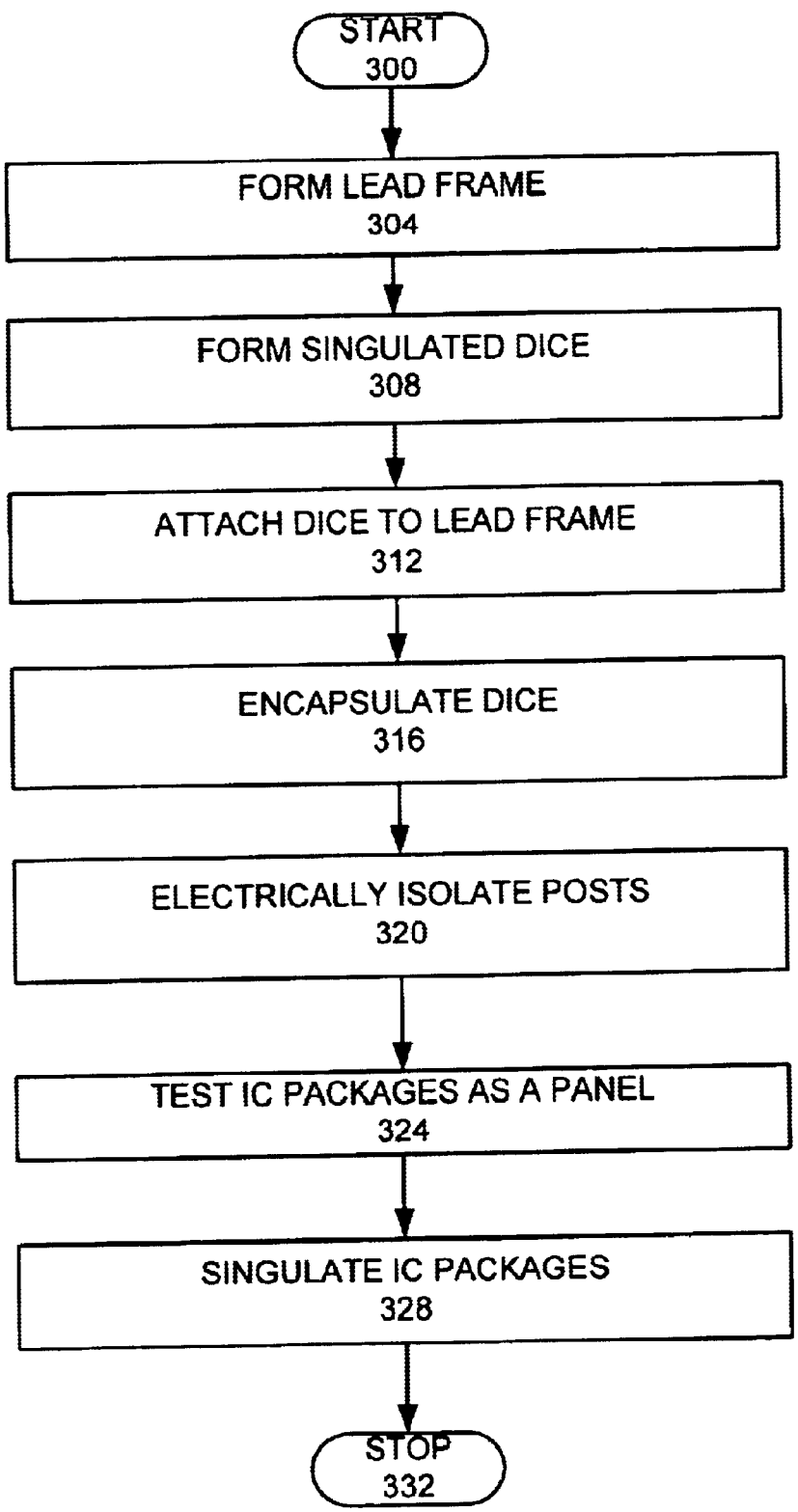
FIG. 3 is a flow chart of a process used in a preferred embodiment of the invention.
Figure 4:
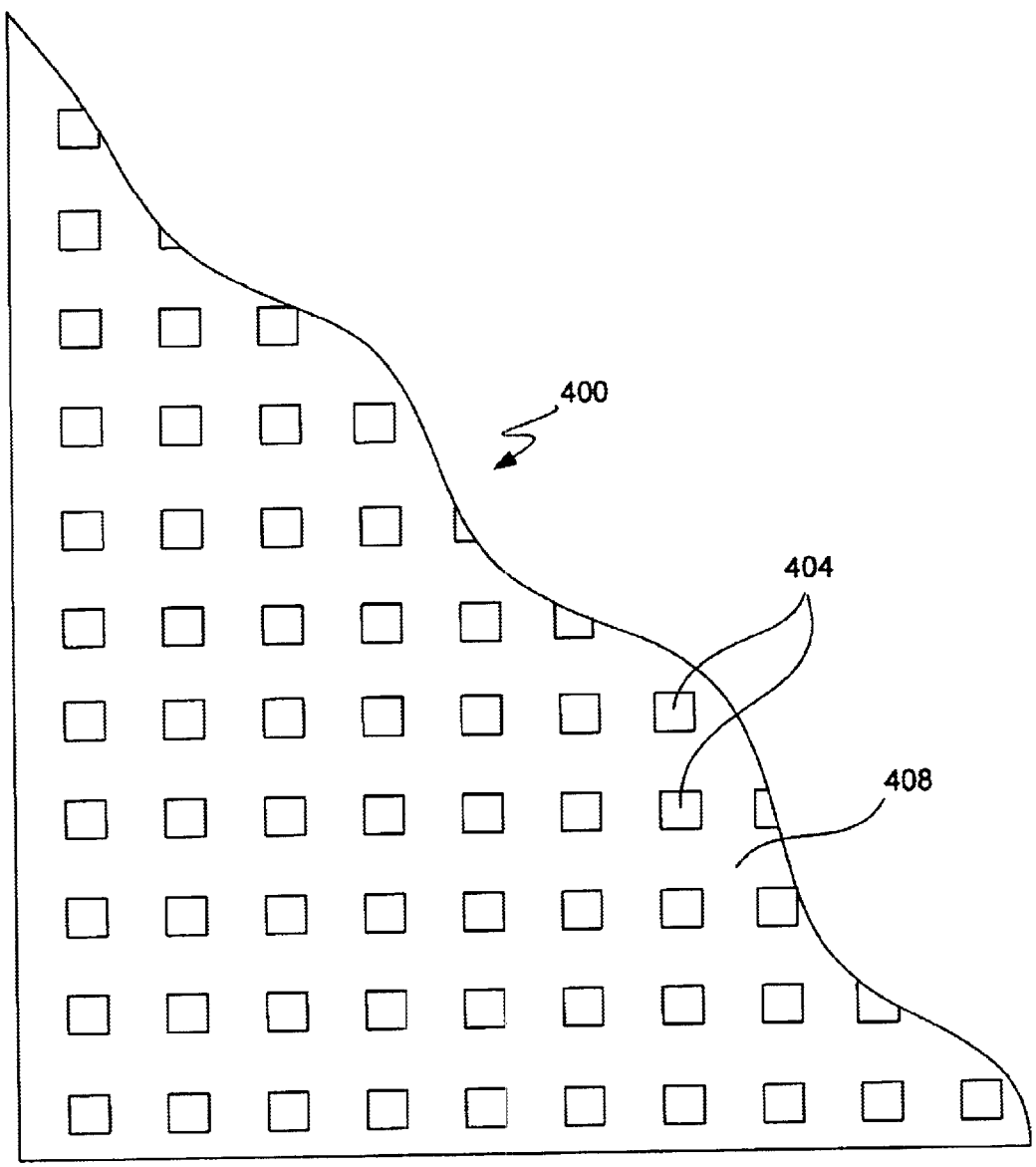
FIG. 4 is a top view of part of a metal sheet, which is formed to a lead frame.
Figure 5:
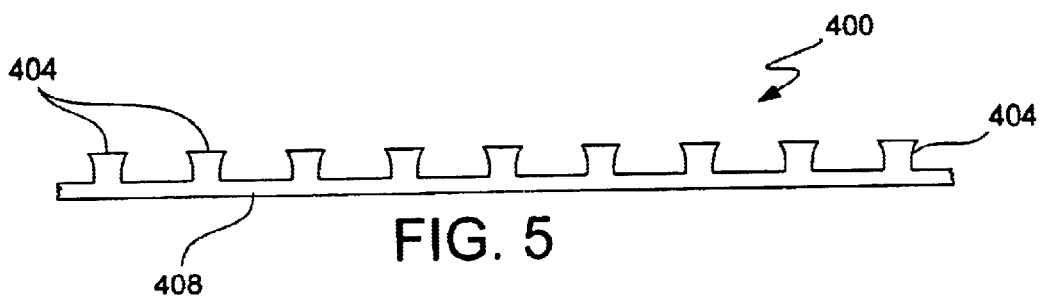
FIG. 5 is a cross-sectional view of part of the lead frame.

To facilitate discussion, FIG. 3 is a flow chart of a method used in a preferred embodiment of the invention. A lead frame is formed (step 304). FIG. 4 is a top view of part of a metal sheet, which is formed to a lead frame 400. The lead frame 400 is preferably copper; however, other electrically conductive materials, such as Alloy 42, may be used instead. FIG. 5 is a cross-sectional view of part of the lead frame 400. The lead frame 400 may be formed by stamping or etching a sheet of metal. The lead frame 400 provides a plurality of posts 404. In this embodiment, the posts 404 all have the same cross-section. In addition, the posts 404 are spaced apart to form an array. The array is formed by aligning posts vertically and horizontally in columns and rows, so that the vertical spacing is equal to the horizontal spacing. In other embodiments the spacing and location of the posts may vary to meet specific requirements. As illustrated, in this embodiment a connecting sheet 408 extends through the lead frame 400 so that the connecting sheet 408 is connected to an end of each of the posts 404. The connecting sheet 408 is imperforate in that it extends between the posts 404 without any apertures. Plating, such as silver plating, may be added to the lead frame 400. Much of the packaging handling equipment is designed for handling lead frame strips; therefore, the part of the lead frame shown may be a part of a lead frame strip. Such a lead frame strip may provide a skirt surrounding several connecting sheets with posts. Such connecting sheets would be imperforate with the skirt having apertures to relieve stress. Alternatively, the part of the lead frame shown may be part of a square or rectangular panel.

Figure 1:
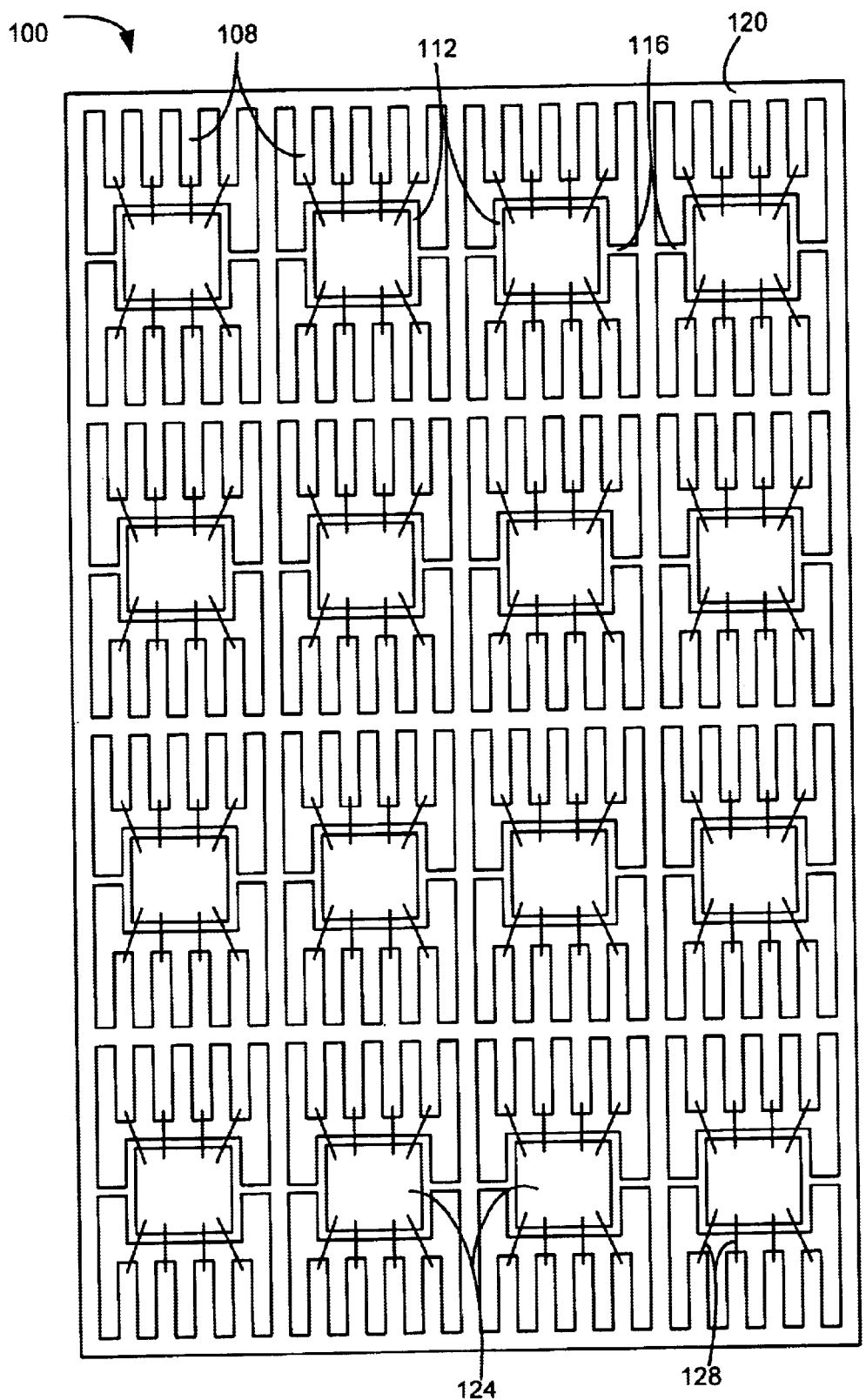
FIG. 1 is a top view of a lead frame and die assembly used in the prior art.
Figure 2:
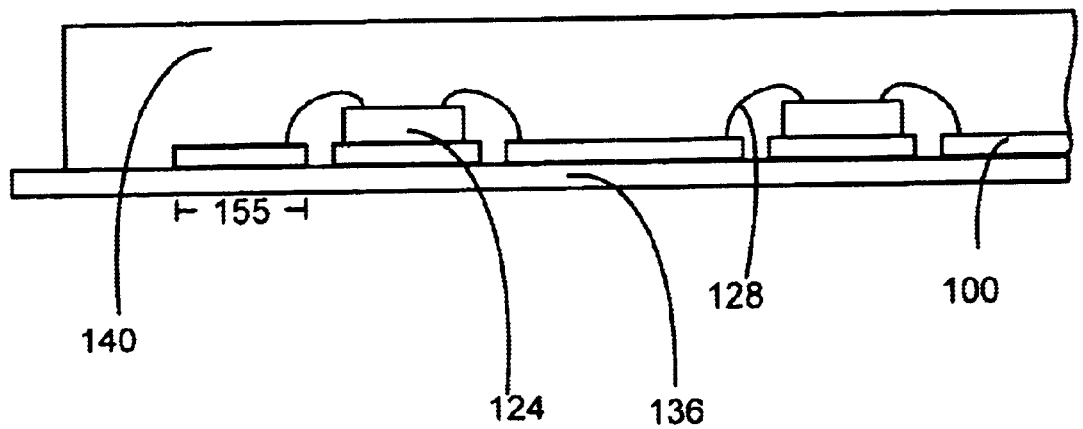
FIG. 2 is a cross-sectional view of part of the lead frame panel illustrated in FIG. 1.
Figure 6:
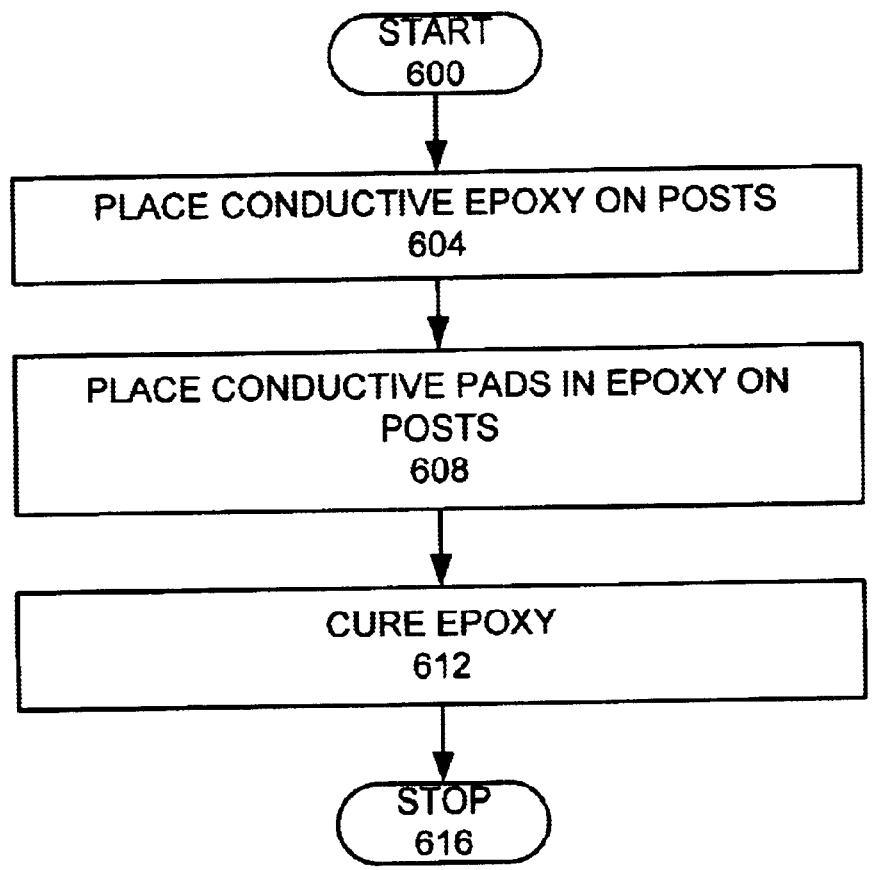
FIG. 6 is a detailed flow chart of one embodiment of the step of attaching the dice to the lead frame.
Figure 7:
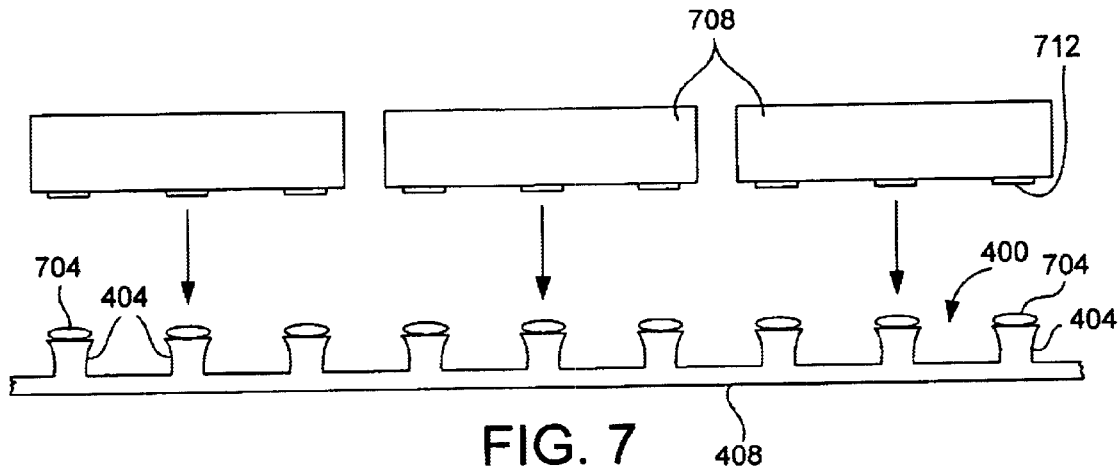
FIG. 7 is a cross-sectional view of a lead frame with conductive epoxy and with dice.
Figure 8:
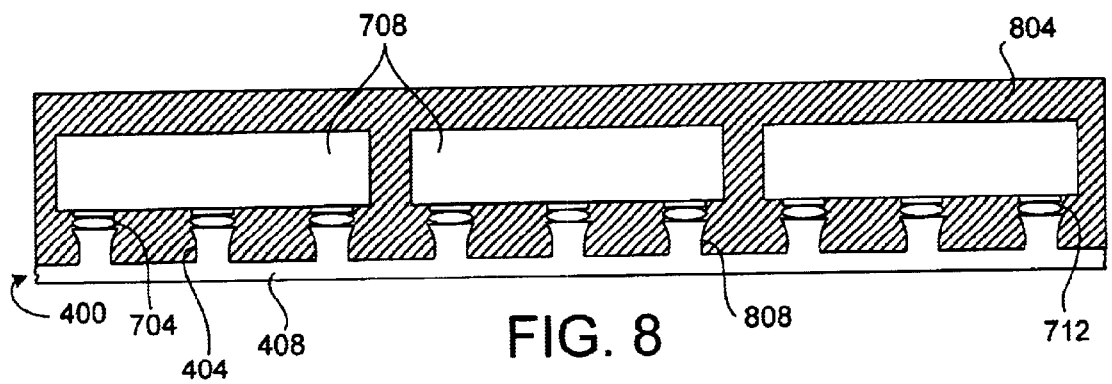
FIG. 8 is a cross-sectional view of encapsulated dice mounted on the lead frame.

A plurality of singulated dice is formed (step 308). The dice are then attached to the lead frame 400 (step 312). FIG. 6 is a detailed flow chart of one embodiment of the step of attaching the dice to the lead frame. In this embodiment, a conductive epoxy 704 is placed on an upper surface of the posts 404 of the lead frame 400 (step 604), as shown in FIG. 7. A roller may be used to place the epoxy on the upper surface of the posts 404. To place the conductive pads of the dice in the conductive epoxy (step 608), dice 708 are placed over the posts 404 with the side of the dice having conductive pads 712 closest to the conductive epoxy 704, as shown in FIG. 7. The dice 708 are electrically and mechanically mounted on upper parts of the posts 404 by placing the conductive pads 712 in the conductive epoxy 704 so that the conductive side of each die is facing the posts 404, as shown in FIG. 8. The epoxy 704 may be regular conductive epoxy, which is applied just before the dice are placed. In the alternative, the epoxy may be a conductive B stage epoxy, which is applied and partially cured. After the dice are placed, the conductive stage B epoxy is reheated to melt the epoxy. Once the dice 708 are mounted, the conductive epoxy 704 may be dried and cured (step 612). The conductive pads 712 are on the conductive side of the dice, so that the conductive side of the dice is the closest part of each die to the posts.

The dice 708 may then be encapsulated (step 316). Using conventional molding the lead frame 400 can be encapsulated by an encapsulating material 804, as shown in FIG. 8. If a dispensing method is used, then a dam may be placed around the lead frame 400. Since the connecting sheet 408 is imperforate in that it extends between the posts without any apertures, the connecting sheet prevents the encapsulating material from flowing under the lead frame 400, thus keeping the encapsulating material on one side of the lead frame 400. The encapsulating material may then be hardened and cured to form a cap. One cap may be used to cover the entire lead frame. In the alternative, several caps may be provided at various parts of the lead frame. In this embodiment, the posts 404 have curved sides 808 to provide additional locking of the encapsulating material 804 to the posts 404.

Figure 9:
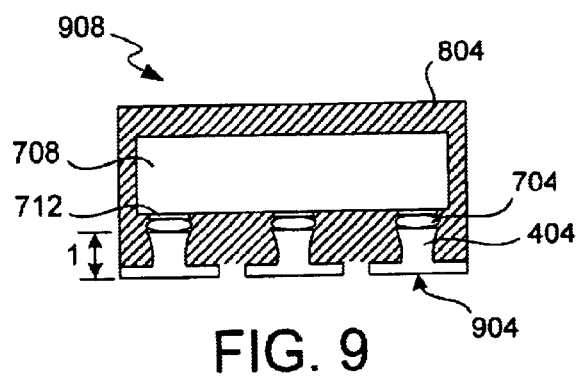
FIG. 9 is a cross-sectional view of a singulated integrated circuit package.

The lead frame 400, dice 708, and encapsulating material 804 may be mounted on sticky tape and then placed on a vacuum chuck of sawing equipment, which is known in the art. The sawing equipment may be used for removing all or parts of the connecting sheet 408 to electrically isolate the posts 440 (step 320). In such a removal process, the sawing equipment may cut through only the connecting sheet 408 between the plurality of posts 404. The removal of parts of the connecting sheet forms the posts 404 into lead fingers 904, which may be electrically isolated from each other, as shown in FIG. 9. Etching may be used in the alternative to make isolated lead fingers. In the alternative, the connecting sheet may be polished off. Since the IC packages have not been singulated, the IC packages are in one piece held together by the encapsulating material 804. This allows all IC packages to be tested in panel form (step 324), which allows faster and easier testing. After testing, the saw equipment may then be used to singulate the lead frame 400, dice 708, and encapsulating material 804 into individual IC packages 908 (step 328), as shown in FIG. 9. In such a singulation process, the sawing equipment cuts through the encapsulating material 804.

If panel testing is not desired, then the chip scale IC packages may be singulated before electrical testing. In such a case, singulation may be performed during the step of removing the connection sheet. In other embodiments, other methods besides using saw equipment, such as etching or laser cutting, may be used to remove the connection sheet and/or for singulation.

The lead fingers 904 or lead posts 404 have a length "1" which extends from the top of the posts 404 to the bottom of the posts, wherein the length "1" is substantially perpendicular to the conductive surface of the die, as shown. The length "1" of the lead fingers 904 or lead posts 404 is more perpendicular to the conductive surfaces of the dice than parallel to the conductive surfaces as was shown in the description of the prior art. The resulting IC package has a footprint on the order of the footprint of the die, as shown. Since the lead fingers are on only a single side of the die, which is the conductive side of the die, and since the length of the lead fingers is perpendicular to the conductive surface of the die, the footprint of the lead fingers is about equal to the footprint of the die, as shown. The conductive epoxy provides both a mechanical connection between the die and lead frame and an electrical connection between the conducting pads and the posts of the lead frame. The frame allows dice of different sizes and different input/output counts may be accommodated. In some embodiments, all of the connecting sheets are removed and in other embodiments at least part of the connecting sheet is removed so that the posts may be formed into electrically isolated lead fingers. No wire bonding is required in this embodiment, thus eliminating a processing step.

In another embodiment of the invention, using FIG. 3 as a high-level flow chart, a lead frame is formed (step 304).

Figure 10:
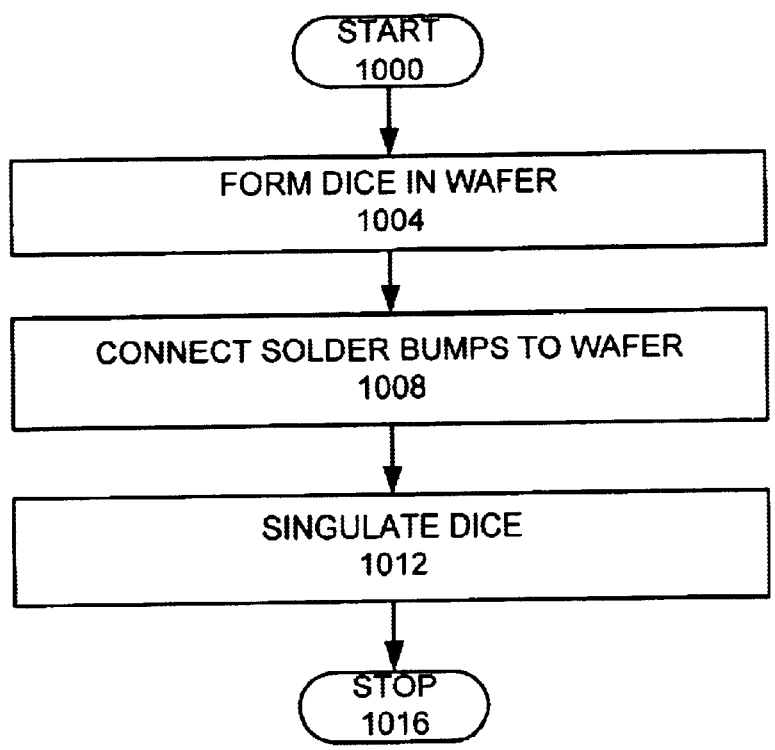
FIG. 10 is a flow chart of the forming of the singulated dice in another embodiment of the invention.
Figure 11:
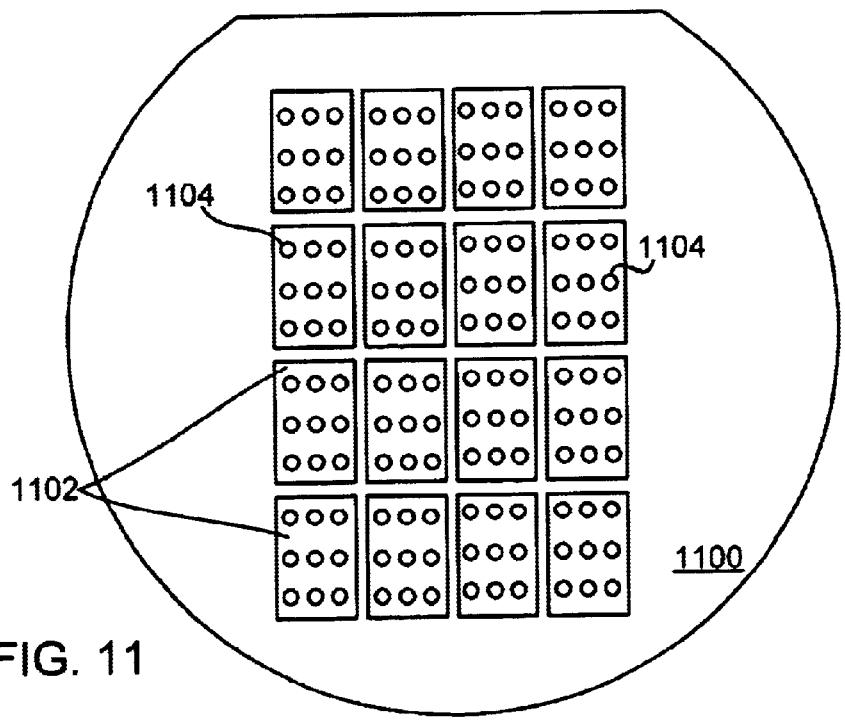
FIG. 11 is a top view of a wafer with a plurality of bumped dice.
Figure 12:
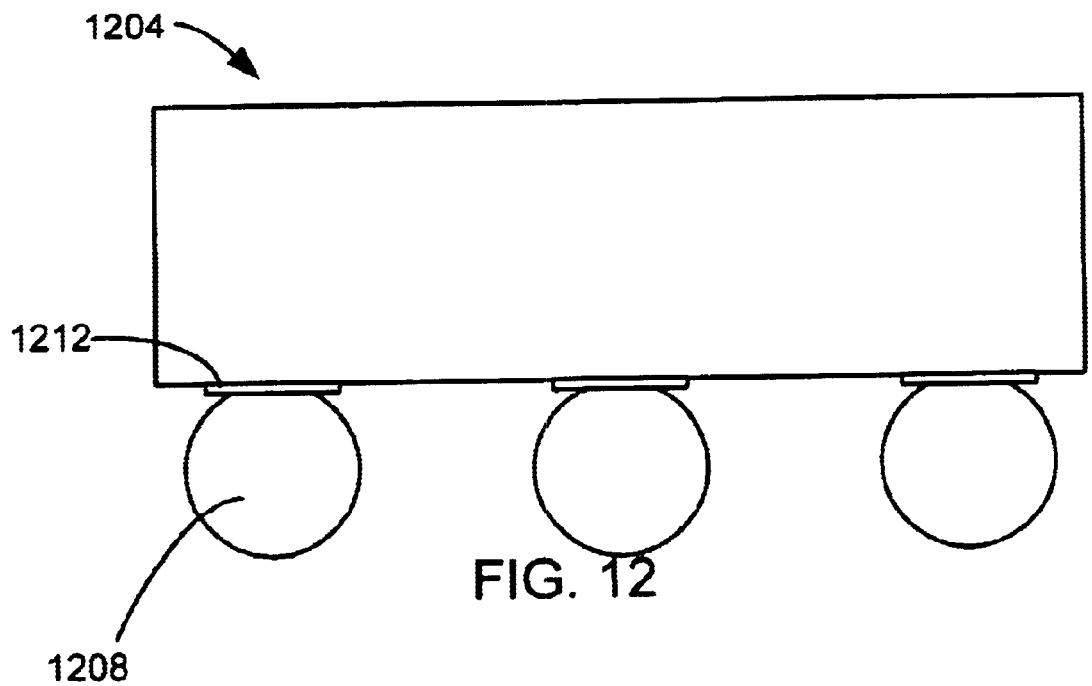
FIG. 12 is a side view of a singulated die with solder bumps attached to conductive pads.

The lead frame may be the same lead frame shown in FIGS. 4 and 5. Singulated dice are also formed (step 308). FIG. 10 is a flow chart of the forming of the singulated dice in this embodiment of the invention. First dice are formed on a wafer (step 1004). FIG. 11 is a top view of a wafer 1100 with a plurality of dice 1102. Bumps of conductive material, such as solder bumps 1104, are formed on conductive pads of the dice 1102 (step 1008). The wafer 1100 is then cut to singulate the bumped dice (step 1012). In other embodiments, these steps may be done in a different order, such as singulating the dice before adding the bumps of conductive material. FIG. 12 is a side view of a singulated die 1204 with solder bumps 1208 attached to conductive pads (attach pads) 1212. The conductive pads are on the conductive side of each die.

Figure 13:
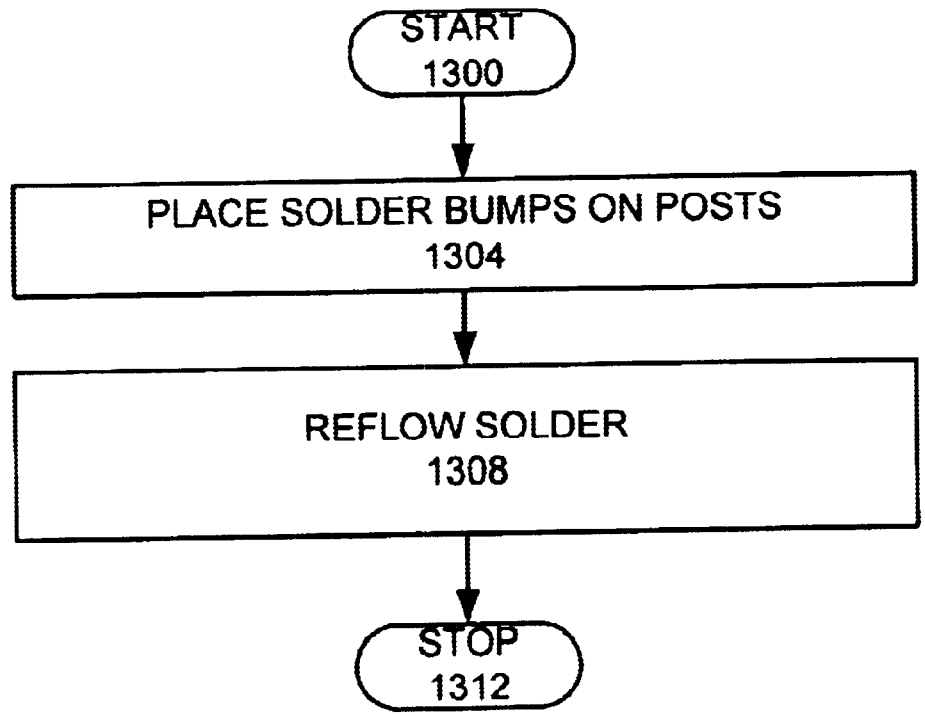
FIG. 13 is a detailed flow chart of the step of attaching the singulated bumped dice to the metal frame.
Figure 14:
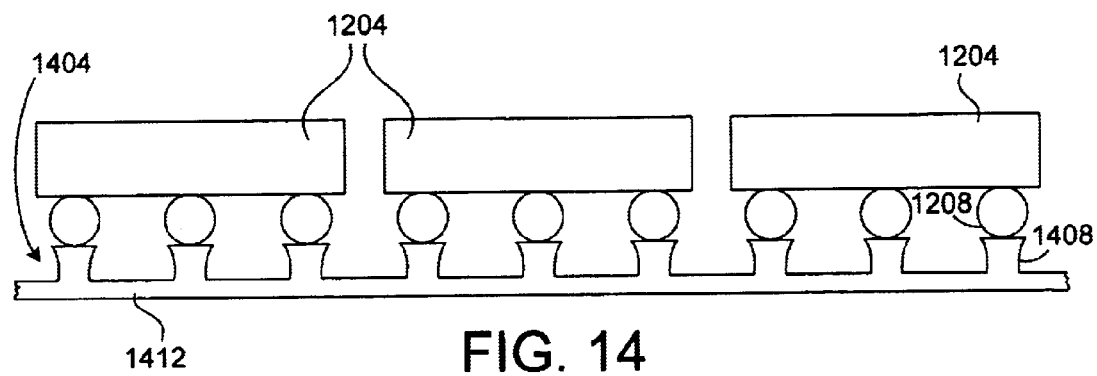
FIG. 14 is a cross-sectional view of a lead frame with bumped dice attached.

The singulated bumped dice are then attached to the lead frame (step 312). FIG. 13 is a detailed flow chart of the step of attaching the singulated bumped dice to the lead frame. The dice 1204 are placed on the lead frame 1404 so that the solder bumps 1208 are placed on an upper surface of the posts 1408, as shown in FIG. 14. Since the solder bumps are on the conductive side of each die, the conductive side of each die is closest to the posts. The solder bumps 1208 are reflowed (1308), which comprises softening the solder possibly by heating so that the solder bumps 1208 become attached to the posts 1408. The solder electrically and mechanically connects the conductive pads to the posts.

A solder past may be added to the top of the posts before the bumped dice are placed. In the alternative, a solder paste may be added to the top of the post and dice that are not bumped may be used.

Figure 15:
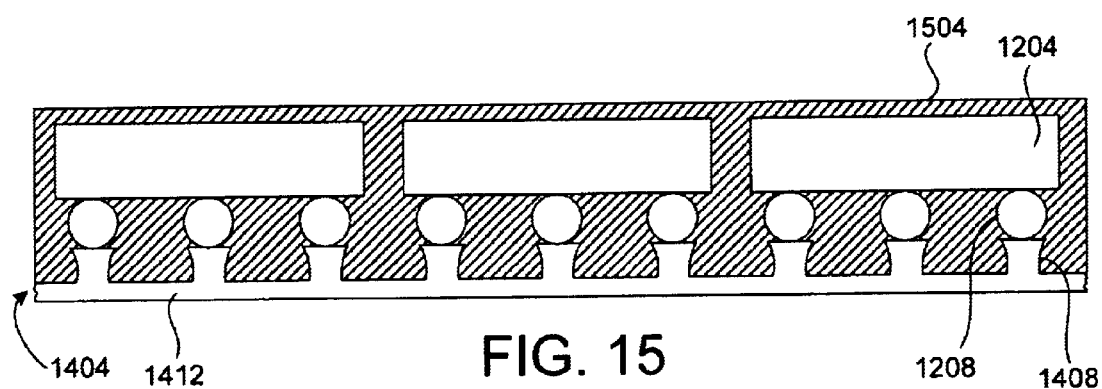
FIG. 15 is a cross-sectional view of part of the lead frame and dice after encapsulation.

The dice 1204 may then be encapsulated (step 316). Using conventional molding, the dice 1204 can be encapsulated by encapsulating material 1504, as shown in FIG. 15. If a dispensing method is used, then a dam may be placed around the lead frame 1404. The connecting sheet 1412 helps to prevent the encapsulating material from flowing under the lead frame 1404, thus keeping the encapsulating material on one side of the lead frame 1404. The encapsulating material 1504 may then be hardened and cured to form a cap. One cap may be used to cover the entire lead frame. In the alternative, several caps may be provided at various parts of the lead frame.

Figure 16:
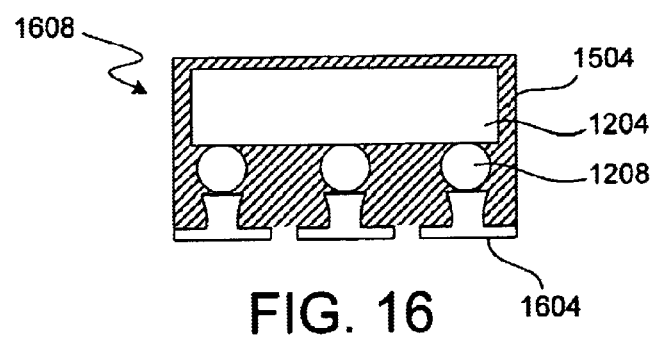
FIG. 16 is a cross-sectional view of a resulting IC package with leads.

The lead frame 1404, dice 1204, and encapsulating material 1504 may be mounted on sticky tape and then placed on a vacuum chuck of sawing equipment, which is known in the art. The sawing equipment may be used for removing at least part of the connecting sheet 1412 (step 320). In such a removal process, the sawing equipment cuts through only the connecting sheet 1412 between the posts 1408. The removal of at least part of the connecting sheet forms the posts 1408 into lead fingers 1604, which may be electrically isolated from each other, as shown in FIG. 16. If the IC packages have not been singulated, the frame is in one piece held by the encapsulating material 1504, which allows all IC packages to be tested in panel form (step 324). After testing, the saw equipment may then be used to singulate the lead frame 1404, dice 1204, and encapsulating material 1504 into individual IC packages 1608, as shown in FIG. 16. In such a singulation process, the sawing equipment cuts through the encapsulating material 1504.

The use of a saw to separate the posts provides the lead fingers 1604 or pins. Such lead fingers or pins are preferable. In the alternative, the connecting sheet may be thinned by etching, as described in U.S. patent application Ser. No. 09/528,540, entitled "Leadless Packaging Process Using a Conductive Substrate," by Bayan et al., filed Mar. 20, 2000, to provide a leadless IC package.

Since the lead frame 1404 has the same array as described in the previous embodiment, the lead frame 1404 is a universal lead frame, which may accommodate dice of different sizes.

Figure 17:
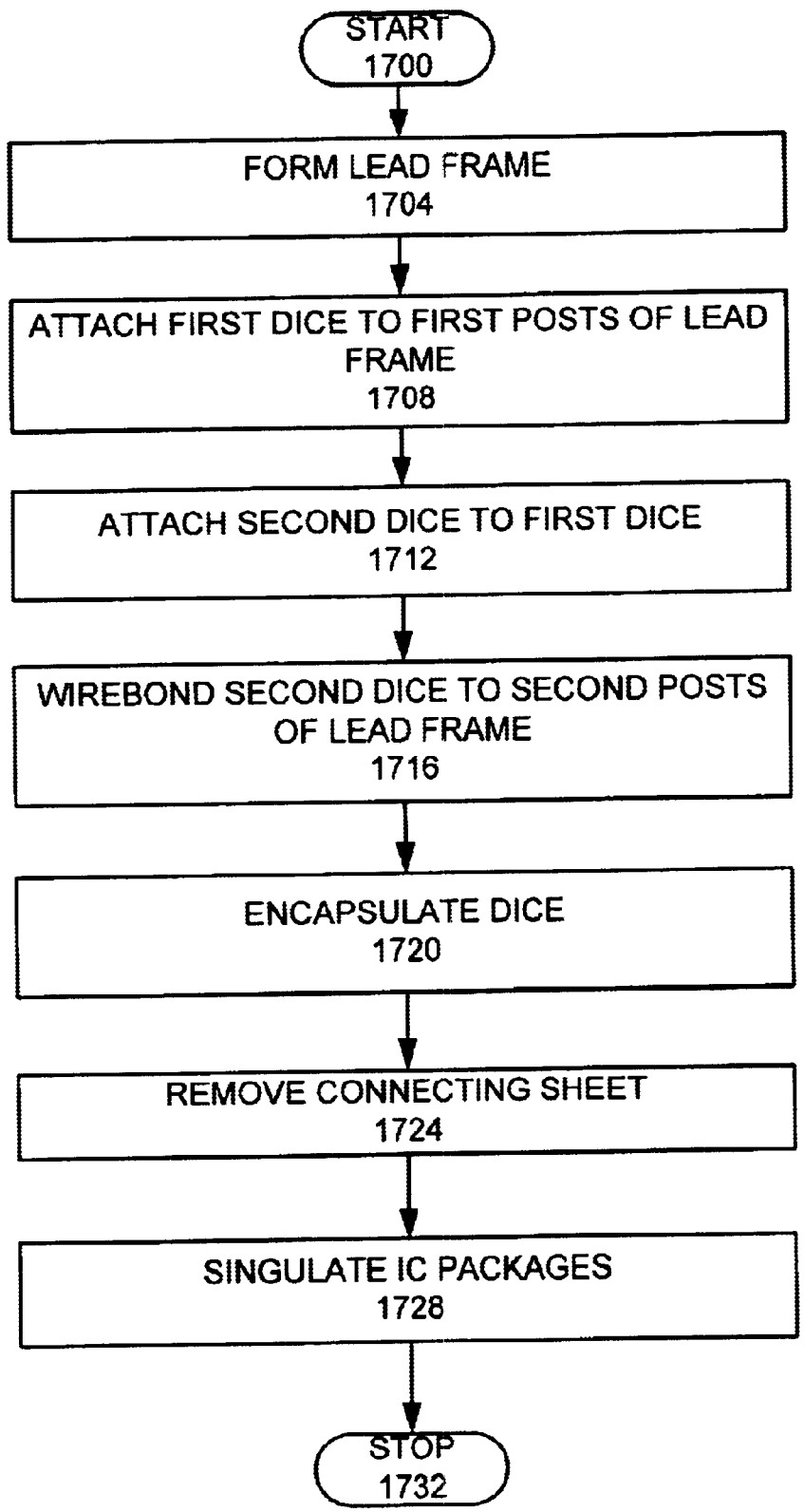
FIG. 17 is a flow chart of a method of making another embodiment of the invention.
Figure 18:
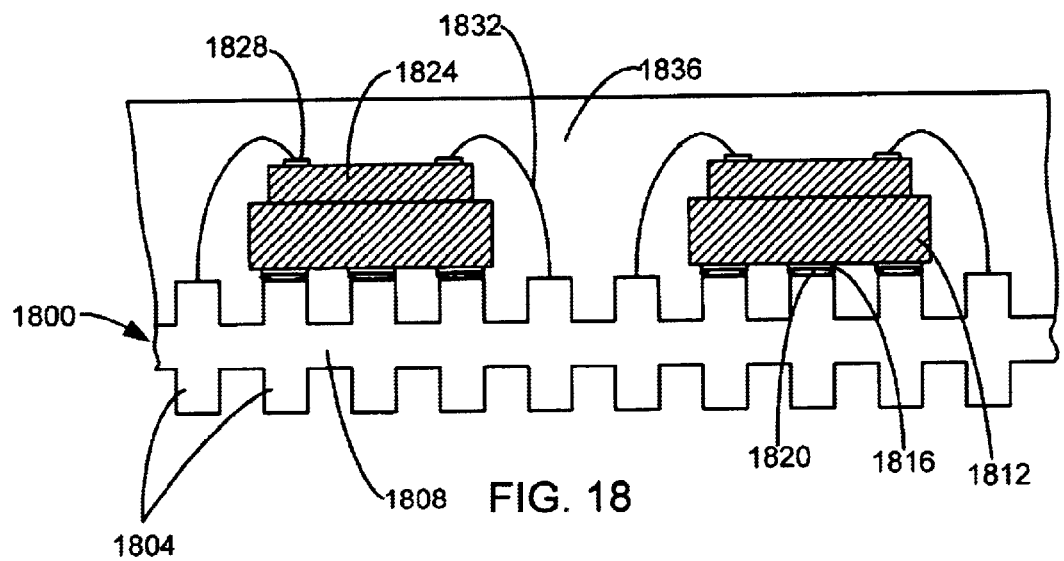
FIG. 18 is a cross-sectional view of a lead frame and dice after encapsulation.

FIG. 17 is a flow chart of a method of making another embodiment of the invention. A lead frame is formed (step 1704). FIG. 18 is a cross-sectional view of part of a lead frame 1800 that may be used in this embodiment of the invention. The lead frame 1800 may be formed by stamping or etching a sheet of metal. The lead frame 1800 provides a plurality of posts 1804. In this embodiment, the posts 1804 all have the same cross-section. In addition, the posts 1804 are spaced apart to form an array. As illustrated, in this embodiment a connecting sheet 1808 extends through the lead frame 1800 so that the connecting sheet 1808 is connected through the center of each of the posts 1804. The connecting sheet 1808 is imperforate in that it extends between the posts 1804 without any apertures. Plating, such as silver plating, may be added to the lead frame 1800.

A plurality of first dice 1812 is attached to the lead frame 1800 (step 1708). A plurality of conductive pads 1816 is on a conductive side of the first dice 1812. The conductive pads 1816 are electrically and mechanically attached to a first set of the plurality of posts 1804 by an electrically conductive adhesive 1820, such as conductive epoxy or solder. Since the conductive pads are held to posts by an electrically conductive adhesive 1820, the conductive side of the first dice 1812 is adjacent to the first set of the plurality of posts 1804 and the conductive side of the dice is the closest part of each die to the posts.

A plurality of second dice 1824 is attached to the plurality of first dice 1812, so that a non-conductive side of each second die 1824 is attached to a non-conductive side of a first die 1812. Conductive pads 1828 on a conductive side of the second dice 1824 are electrically connected to a second set of the plurality of posts 1804 by wire bonds 1832 (step 1716). The non-conductive sides of the first die 1812 are opposite from the conductive sides of the first dice 1812, and the non-conductive sides of the second dice 1824 are opposite from the conductive sides of the second dice 1824, as shown.

The plurality of first dice 1812 and plurality of second dice 1824 may then be encapsulated (step 1720). Using conventional molding the lead frame 1800 can be encapsulated by an encapsulating material 1836. Since the connecting sheet 1808 is imperforate in that it extends between the posts without any apertures, the connecting sheet prevents the encapsulating material from flowing under the lead frame 1800, thus keeping the encapsulating material 1836 on one side of the lead frame 1800. The encapsulating material may then be hardened and cured to form a cap. One cap may be used to cover the entire lead frame. In the alternative, several caps may be provided at various parts of the lead frame.

Figure 19:
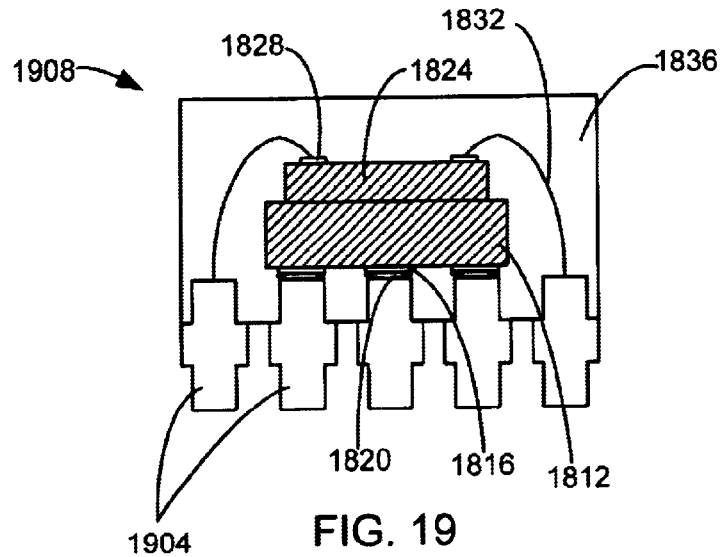
FIG. 19 is a cross-sectional view of a resulting IC package.

The lead frame 1800 and encapsulating material 1836 may be mounted on sticky tape and then placed on a vacuum chuck of sawing equipment, which is known in the art. The sawing equipment may be used for removing all or parts of the connecting sheet 1808 (step 1724). In such a removal process, the sawing equipment may cut through only the connecting sheet 1808 between the plurality of posts 1804. The removal of parts of the connecting sheet forms the posts 1804 into lead fingers 1904, which may be electrically isolated from each other, as shown in FIG. 19. Since the IC packages have not been singulated, the IC packages are in one piece held together by the encapsulating material 1836. This allows all IC packages to be tested in panel form, which allows faster and easier testing. After testing, the saw equipment may then be used to singulate the lead frame 1800 and encapsulating material 1836 into individual IC packages 1908 (step 1728). In such a singulation process, the sawing equipment cuts through the encapsulating material 1836.

If panel testing is not desired, then the chip scale IC packages may be singulated before electrical testing. In such a case, singulation may be performed during the step of removing the connection sheet. In other embodiments, other methods besides using saw equipment, such as etching or laser cutting, may be used to remove the connection sheet and/or for singulation.

The resulting IC package is able to package a first die and a second die with a resulting footprint that is slightly larger than one of the dice. By mounting the first die so that the conductive side is facing the lead fingers so that the lead fingers are directly connected to the conductive pads, the lead fingers have a footprint about equal to the footprint of the first die. In addition, the placement of the conductive side of the first die adjacent to the lead fingers allows the placement of a non-conductive side of the second die on a non-conductive side of the first die, so that the conductive side of the second die faces away from the lead fingers. The wire bonding of conductive pads of the second die to the second set of lead fingers provides an IC package footprint for two packaged dice, which is about equal to the footprint of a conventional IC package for a single die.

In other embodiments, a universal lead frame with an array of posts may have the posts in the array closer together (a smaller distance and pitch between posts) to allow a higher number of contact posts for a particular die size. In another embodiment, a universal lead frame may have a rectangular array where the posts are arranged in columns and rows where the distance between (pitch of) the rows is different than the distance between the columns. Posts in other embodiments may be rectangular, circular, or have some other cross-section instead of having a square cross-section. The posts may be placed in other patterns, such as in a circular pattern.

Other methods may be used to bond the die to the lead frame, with these methods preferably providing an electrically conductive mechanical bond between the conductive pads and the posts.

While this invention has been described in terms of several preferred embodiments, there are alterations, modifications, permutations, and substitute equivalents which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for packaging integrated circuits, comprising:
   providing a lead frame of a conductive material with an array of lead posts that are equally spaced apart and a connecting sheet connecting each of the lead pots;
   attaching a plurality of fist dice to the lead frame, wherein each first die is electrically and mechanically connected to a plurality of lead posts within the array of lead posts, and wherein a conductive side of each first die faces the lead posts;
   encapsulating the plurality of dice with an encapsulating material; and
   removing a thin portion of the connecting sheet between each of the lead posts to electrically isolate each of the lead posts wherein an unremoved portion of the connecting sheet remains connected to each lead post and forms an oversized contact pad on a bottom surface of the packaged integrated circuits, wherein the oversized contact pad has a diameter that is larger than a diameter of each of the lead posts.

2. The method, as recited in claim 1, further comprising singulating the encapsulated first dice.

3. The method, as recited in claim 2, wherein attaching the plurality of first dice to the lead frame comprises placing a conductive epoxy between conductive pads on the plurality of dice and each of the lead posts.

4. The method, as recited in claim 3, further comprising testing the integrated circuit packages as a panel before the step of singulation.

5. The method, as recited in claim 4, wherein the removing of the connecting sheet forms lead fingers.

6. The method, as recited in claim 5, wherein the conductive side of a die of the plurality of dice comprises a plurality of spaced apart conductive pads, wherein the conductive epoxy electrically and mechanically connects each conductive pad to one of the lead posts.

7. The method, as recited in claim 6, wherein the placing the conductive epoxy comprises:
   placing the conductive epoxy on an upper surface of each of the lead posts; and
   placing a plurality of dice so that each conductive pad is placed into contact with the conductive epoxy on the upper surface of a respective lead post.

8. The method, as recited in claim 2, further comprising:
   attaching a plurality of second dice to the plurality of first dice, wherein each second die has a conductive side and a side opposite the conductive side, wherein the side opposite the conductive side of each second die is connected to a side opposite the conductive side of a respective first die, wherein each second die has a plurality of conductive pads on the conductive side of the second die; and
   wirebonding, conductive pads of each second die to lead posts of the array of lead posts of the lead frame, wherein encapsulating the plurality of first dice encapsulates the plurality of second dice.

9. A method as recited in claim 1 wherein at least three die are connected to lead posts within the array of lead posts.

10. A method as, recited in claim 1 wherein the array of lead posts is at least ten by ten in size.

11. A method as recited in claim 1 wherein the removing of the thin portions of the connecting sheet is performed by passing a rotating saw blade over the connecting sheet.

12. A method as recited in claim 1 wherein the connecting sheet is imperforate and wherein the array of lead posts are integrally formed with the connecting sheet and extend from a top surface of the connecting sheet.

13. A method as recited in claim 1 wherein the encapsulating material is formed into a single flat panel that encapsulates the plurality of dice.

14. A method for manufacturing a packaged semiconductor device comprising:
   providing a conductive lead frame having an imperforate connecting sheet and an array of integrally formed lead posts that extend from a top surface of the connecting sheet;

attaching a plurality of semiconductor dice onto the lead frame wherein a first surface of each die, which has contact pads, is placed in contact with the array of lead posts;

applying liquid molding material over the dice and lead frame such that the molding material fills in voids between the lead posts and covers the dice.

15. A method as recited in claims further comprising:

removing a thin portion of the connecting sheet between each of the lead posts to electrically isolate each of the lead posts wherein an unremoved portion of the connecting sheet remains connected to each lead post and forms an oversized contact pad on a bottom surface of the packaged semiconductor device, wherein the oversized contact pad has a diameter that is larger than a diameter of each of the lead posts.

16. A method as recited in claim 15 further comprising:

singulating each of the packaged semiconductor devices from the lead frame.

17. A method as recited in claim 14 further comprising:

curing the liquid molding, material so that a single flat molding material panel encapsulates multiple semiconductor dice.

18. A method for manufacturing a packaged semiconductor device comprising:

providing a conductive lead frame having an imperforate connecting sheet and a uniform two-dimensional array of integrally formed lead posts that extend from a top surface of the connecting sheet, the connecting sheet being suitably sized such that a plurality of semiconductor dice can be mounted onto at least some of the posts in a two-dimensional array;

attaching a plurality of semiconductor dice onto the lead frame wherein a first surface of each die, which has contact pads, is placed in contact with the array of lead posts;

applying liquid molding material over the dice and lead frame such that the molding material fills in voids between the lead posts and covers the dice.

19. A method as recited in claim further comprising:

removing a thin portion of the connecting sheet between each of the lead posts to electrically isolate each of the lead posts wherein an unremoved portion of the connecting sheet remains connected to each lead post and forms an oversized contact pad on a bottom surface of the packaged semiconductor device, wherein the oversized contact pad has a diameter that is larger than a diameter of each of the lead posts.

20. A method as recited in claim 18 further comprising:

curing the liquid molding material so that a single flat molding material panel encapsulates multipe semiconductor dice.

* * * * *